United States Patent [19]
Elrabaa et al.

[11] Patent Number: 5,602,774
[45] Date of Patent: Feb. 11, 1997

[54] LOW-POWER BICMOS/ECL SRAM

[75] Inventors: Muhammad S. Elrabaa, Hillsboro, Oreg.; Mohamed I. Elmasry, Waterloo, Canada

[73] Assignee: University of Waterloo, Waterloo, Canada

[21] Appl. No.: 558,896

[22] Filed: Nov. 16, 1995

[51] Int. Cl.⁶ .................................................. G11C 11/40
[52] U.S. Cl. .............. 365/177; 365/189.05; 365/189.11; 365/189.08; 365/190; 365/205; 365/225.6; 365/230.06; 365/230.08
[58] Field of Search .............................. 365/177, 189.05, 365/189.11, 190, 205, 225.6, 227, 230.06, 230.08, 189.08

[56] References Cited

U.S. PATENT DOCUMENTS

5,331,219  7/1994  Nakamura .................................. 326/62

*Primary Examiner*—David C. Nelms
*Assistant Examiner*—Andrew Q. Tran
*Attorney, Agent, or Firm*—Connolly & Hutz

[57] ABSTRACT

A SRAM includes an ECL input buffer connected between an address bus and a W-OR predecoder array. The logic output of the W-OR predecoder array is applied to a level translator array and level shifted. The level shifted output of the level translator array is supplied to a plurality of self-resetting word-line decoder and driver (WLDD) circuits. The WLDD circuits supply activation pulses to selected blocks of memory in a memory cell array. Sense amplifiers sense and latch-in the data stored in the activated selected blocks of memory. The design of the W-OR predecoder array, level translator array, WLDD circuits and sense amplifiers is such to reduce the overall power consumption of the SRAM.

36 Claims, 9 Drawing Sheets

| $A_i$ | $A_{i+1}$ | $A_i + A_{i+1}$ | $A_i + \overline{A_{i+1}}$ | $\overline{A_i} + A_{i+1}$ | $\overline{A_i} + \overline{A_{i+1}}$ |
|---|---|---|---|---|---|
| L | L | L | H | H | H |
| L | H | H | L | H | H |
| H | L | H | H | L | H |
| H | H | H | H | H | L |

L=LOW   H=HIGH

LOW-POWER BICMOS/ECL SRAM

FIELD OF THE INVENTION

The present invention relates to static random access memory (SRAM) and in particular to a low-power BiCMOS/ECL SRAM and novel circuits for use therein.

BACKGROUND OF THE INVENTION

One of the most successful applications of BiCMOS technology has been in the design of static random access memories (SRAMs). By combining the high-density and lower power dissipation of CMOS technology with the extremely fast speed of bipolar emitter coupled logic (ECL) techniques, BiCMOS/ECL SRAMs have achieved speeds very close to those of bipolar SRAMs at power levels close to those of CMOS SRAMs. In the past, BiCMOS/ECL SRAMs were usually designed to operate at a maximum power level allowed by still or forced-air cooled plastic packages, typically in the range of 600 to 1000 milliwatts for maximum speed. With each new generation of BiCMOS/ECL SRAM, the speed of the BiCMOS/ECL SRAM was enhanced by scaling the technology and/or using novel circuit techniques and architectures, while keeping the power consumption at a relatively constant level.

Although the speed of BiCMOS/ECL SRAMs increased steadily with each new generation while maintaining the power consumption basically constant, a problem existed in that less power was allocated to the ECL input/outputs (I/Os) which increased by 2 with each new generation. Hence, the speed advantage of the ECL I/Os decreased with each new generation. Coupled with the fact that it is very difficult to implement automatic address transition detection (ADT) techniques with ECL address inputs in order to reduce power consumption, the development of asynchronous 16 megabyte+ (Mb+) BiCMOS/ECL SRAMs has been hindered.

Typically, the input buffers, predecoders and level translators consume 40 to 60 percent of a BiCMOS/ECL SRAM's total power. Hence, any reduction in the power consumption of these circuits will amount to a considerable savings in the overall power consumption of the BiCMOS/ECL SRAM.

Another source of power consumption in BiCMOS/ECL SRAMs is a result of the DC power drawn by the memory cell array during memory access. All of the columns in a selected memory block of the memory cell array consume DC power as long as one of the word-lines (WL) of the selected memory block is activated. Techniques such as array division, divided word-line (DWL) and hierarchial word decoding (HWD) which are used to reduce decoding delay, also reduce the block size of the memory blocks and hence, DC currents drawn by them when activated. However, there is a limit to the amount of array division that can be done due to area and delay constraints.

For a 16 Mb SRAM that is divided into 64 memory blocks, the number of columns per memory block is 256. This number is sufficiently large to result in a significant DC current being drawn during memory block activation. If each column in the activated memory block draws a 200 μA current, the total active memory block current would be more than 50 mA. Hence, the DC power consumed by the activated memory block is about 15 to 25 percent of the total active power consumption of the BiCMOS/ECL SRAM.

A scheme to reduce word-line activation time of a 0.5 Mb SRAM was discussed in a paper entitled "A 2-nS Cycle, 3.8-nS Access 512 kb CMOS ECL SRAM with a Pipelined Architecture" authored by T. Chappell et al. and published in the IEEE Journal of Solid-State Circuits, Vol. 26 at pages 1577 to 1585, 1991. The architecture disclosed in this article is intended to reduce the cycle time and pipeline the memory access operation. It utilizes self-resetting blocks for clock generation and global X/Y/Z-decoder lines. The architecture requires a very tight timing control over the self-resetting blocks to ensure correct operation of the SRAM. For a 16 Mb+ SRAM, this is more difficult to achieve and would require the output pulses of the self-resetting blocks to be made long enough to ensure proper operation. However, by increasing the length of the output pulses, power consumption increases. Also, the capacitances on the global decoder lines due to the pulsing of the decoder lines would on average increase the dynamic power dissipation of the SRAM. Accordingly, alternative architectures to reduce SRAM power consumption are continually being sought.

It is therefore an object of the present invention to provide a novel BiCMOS/ECL SRAM and novel circuits for use therein.

SUMMARY OF THE INVENTION

According to one aspect of the present invention there is provided a front-end for a static random access memory having a memory cell array for storing data comprising:

an ECL input buffer receiving address values from an address bus representing memory cell locations in said memory cell array and outputting said address values and complements thereof;

a W-OR predecoder and level translator array connected to said ECL input buffer and receiving said address values and address value complements, said W-OR predecoder and level translator array generating logic OR output values in response to input from said ECL input buffer at MOS signal levels, the level translators in said array being in the form of single source followers connected directly to W-OR predecoders; and self-resetting row decoder and driver circuits responsive to said logic OR output values for generating logic word line output pulses to said memory cell array to activate selected memory cells of said memory cell array corresponding to said address values.

According to another aspect of the present invention there is provided a W-OR predecoder and level translation circuit for the front-end of a static random access memory comprising:

a W-OR predecoder receiving address inputs from an ECL input buffer and generating logic output in response thereto; and a level translator in the form of a single source follower responsive to said W-OR predecoder for level shifting the logic output of said W-OR predecoder.

According to still yet another aspect of the present invention there is provided a row decoder and driver circuit for a static random access memory comprising:

a logic gate responsive to memory block select and word select inputs and generating logic output on an output node in accordance with inputs thereto;

a driver responsive to said memory block select and word select inputs and supplying input to said logic gate; and reset means responsive to a logic high condition on said output node for returning said output node to a logic low condition after a predetermined duration.

According to still yet another aspect of the present invention there is provided a sense amplifier to sense the state of a memory cell in a memory cell array forming a part of a static random access memory comprising:

an emitter-follower input stage receiving input from complementary bit lines connected to an activated memory cell to be sensed; and an ECL amplifier responsive to said emitter-follower input stage and to memory cell activation signals, said ECL amplifier having latched outputs and generating output signals $V_0$ and $\overline{V_0}$ thereon representing the sensed state of said memory cell and the complement thereof.

According to still yet another aspect of the present invention there is provided a static random access memory comprising:

a memory cell array for storing data;

an ECL input buffer receiving address values from an address bus representing memory cell locations in said memory cell array and outputting said address values and complements thereof;

a W-OR predecoder and level translator array connected to said ECL input buffer and receiving said address values and address value complements, said W-OR predecoder and level translator array generating logic OR output values in response to input from said ECL input buffer at MOS signal levels, each W-OR predecoder and level translator in said array including a W-OR predecoder receiving address inputs from said ECL input buffer and generating logic output in response thereto; and a level translator in the form of a single source follower responsive to said W-OR predecoder for level shifting the logic output of said W-OR predecoder;

self-resetting row decoder and driver circuits responsive to said logic OR output for generating logic word line output pulses to said memory cell array to activate selected cells of said memory cell array corresponding to said address values received by said ECL input buffer;

an unclocked latched ECL sense amplifier array connected to bit cells extending to said memory cell array for sensing the data value of memory cells of said memory cell array activated by said word line output pulses;

column decoder and driver circuits responsive to said logic OR output values to activate the sense amplifiers connected to the selected memory cells; and an output buffer for storing the sensed data values of said selected memory cells.

According to still yet another aspect of the present invention there is provided a static random access memory comprising:

a memory cell array for storing data;

an ECL input buffer receiving address values from an address bus representing memory cell locations in said memory cell array and outputting said address values and complements thereof;

a W-OR predecoder and level translator array connected to said ECL input buffer and receiving said address values and address value complements, said W-OR predecoder and level translator array generating logic OR output values in response to input from said ECL input buffer at MOS signal levels;

self-resetting row decoder and driver circuits responsive to said logic OR output for generating logic word line output pulses to said memory cell array to activate selected cells of said memory cell array corresponding to said address values received by said ECL input buffer, each row decoder and driver circuit of said array including a logic gate responsive to memory block select and word select inputs from said W-OR predecoder and level translator array and generating said logic word line output pulses in response thereto; a driver responsive to said memory block select and word select inputs and supply input to said logic gate; and reset means responsive to a logic high word line output pulses and returning the output of said row decoder and driver circuit to a logic low condition after a pre-determined duration;

a sense amplifier array connected to bit cells extending to said memory cell array for sensing the data value of memory cells of said memory cell array activated by said word line output pulses, each sense amplifier including an emitter-follower input stage receiving input from complementary bit lines connected to an activated memory cell to be sensed; and an ECL amplifier responsive to said emitter-follower input stage and to memory cell activation signals, said ECL amplifier having latched outputs and generating output signals $V_0$ and $\overline{V_0}$ thereon representing the sensed state of said memory cell and the complement thereof;

column decoder and driver circuits responsive to said logic OR output values and generating said activation signals to activate the sense amplifiers connected to the selected memory cells; and an output buffer for storing the sensed data values of said selected memory cells.

BRIEF DESCRIPTION OF THE DRAWINGS

Embodiments of the present invention will now be described more fully with reference to the accompanying drawings in which.

DESCRIPTION OF THE PREFERRED EMBODIMENTS

Figure 1:
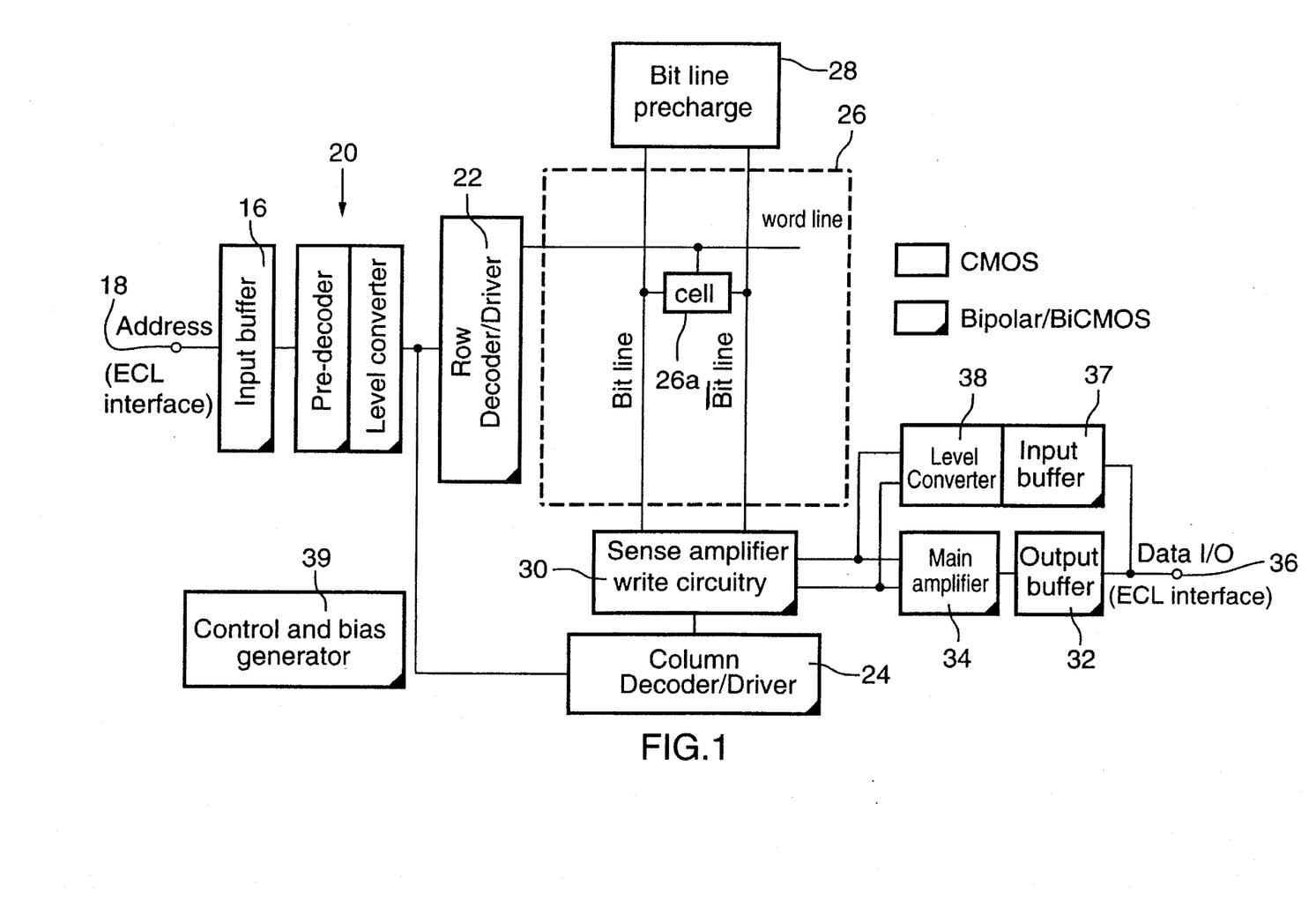
FIG. 1 is a schematic of a BiCMOS/ECL SRAM in accordance with the present invention.

Referring now to FIG. 1, a BiCMOS/ECL static random access memory (SRAM) is shown and is generally indicated by reference numeral 14. SRAM 14 includes an emitter coupled logic (ECL) address input buffer 16 receiving address input $A_i, A_{i+1} \ldots A_{i+n}$ from an address bus 18. The ECL input buffer 16 in turn outputs each address value $A_x$ received from the address bus 18 together with its complement $\overline{A}_x$. Receiving the output of the ECL input buffer 16 is address conditioning circuitry 20. Circuitry 20 provides input to a row decoder and driver 22 as well as to a column decoder and driver 24. Word-lines (WLs) extend from the row decoder and driver 22 and lead to a memory cell array 26. Bit lines extend from the memory cell array 26 and lead to a bit line precharge circuit 28 as well as to a sense amplifier array and write circuitry 30. Each cell 26a in the memory cell array 26 is connected to one of the word lines and to consecutive bit lines Bit and $\overline{\text{Bit}}$ respectively. The sense amplifier array and write circuitry 30 is connected to the column decoder and driver 24 as well as to an ECL output buffer 32 by way of an amplifier 34. The ECL output buffer 32 is also connected to a data bus 36. A data input buffer 37 is also connected to the data bus 36 as well as to the sense amplifier array and write circuitry 30 by way of a level converter 38. A control and bias generator 39 is included in the SRAM 14 to control whether data is to be read from or written to the memory cell array 26.

Figure 2:
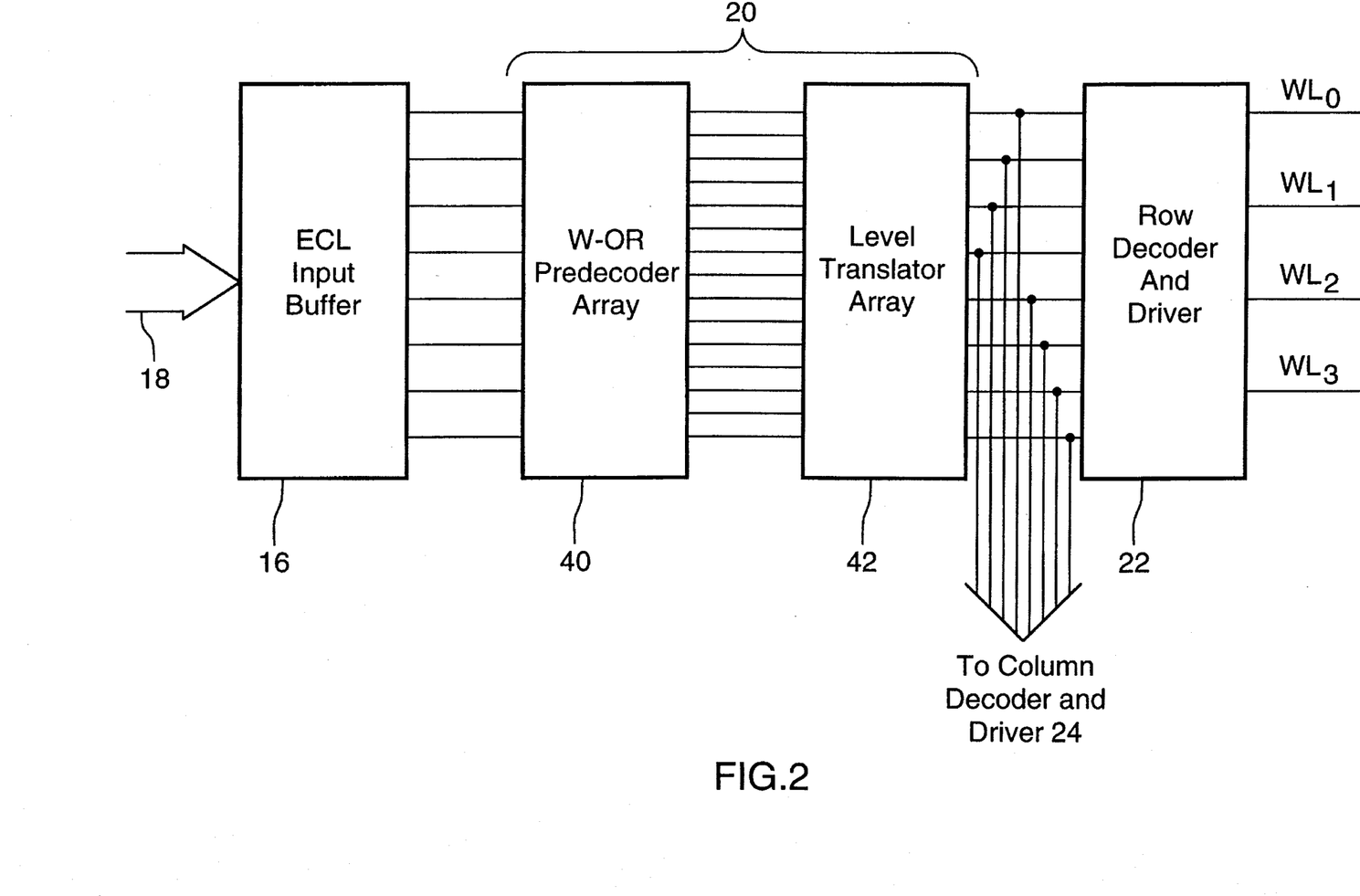
FIG. 2 is a schematic of a portion of the SRAM shown in FIG. 1.

FIG. 2 better illustrates the address conditioning circuitry 20 and the row decoder and driver 22. As can be seen, address conditioning circuitry 20 includes an ECL wired-OR (W-OR) predecoder array 40 connected to the ECL input buffer 16 as well as to a level translator array 42. The level translator array 42 provides block select and word select line inputs to self-resetting word-line decoder and driver (WLDD) circuits 44 (best seen in FIGS. 5 and 6) constituting the row decoder and driver 22. The output of the WLDD circuits 44 is applied to the word-lines $WL_x$ leading to the memory cell array 26. The level translator array 42 also provides input to the column decoder and driver 24.

In operation, when it is desired to read data from the memory cell array 26 and an address is received by the ECL input buffer 167, the address information is predecoded and translated before being supplied to the row and column decoder and drivers 22 and 24 respectively. The row decoder and driver uses the address information to select the desired memory cells 26a corresponding to the received address information. The column decoder and driver 24 uses the address information to activate the sense amplifiers associated with the selected memory cells 26a so that the sense amplifiers can sense the state of the memory cells. The sense amplifiers in turn supply output representing the sensed state of the activated memory cells to the ECL output buffer 32 via amplifier 34.

When it is desired to write data to the memory cell array 26 and an address is received by the ECL input buffer 16, a similar process is carried out with the exception that the column decoder and driver 24 activates the write circuitry associated with the selected memory cells 26a. The write circuitry receives data to be written to the memory cells 26a via input buffer 37 and level converter 38 and writes the data to selected memory cells.

The general operation of SRAM 14 is conventional. However, the design of the SRAM 14 is such to reduce power consumption while maintaining memory cell access speed. In order to reduce power consumption novel circuitry in the W-OR predecoder, level translator and sense amplifier arrays as well as in the WLDD circuits constituting the row decoder and driver 22 has been designed and will now be described.

Figure 3:
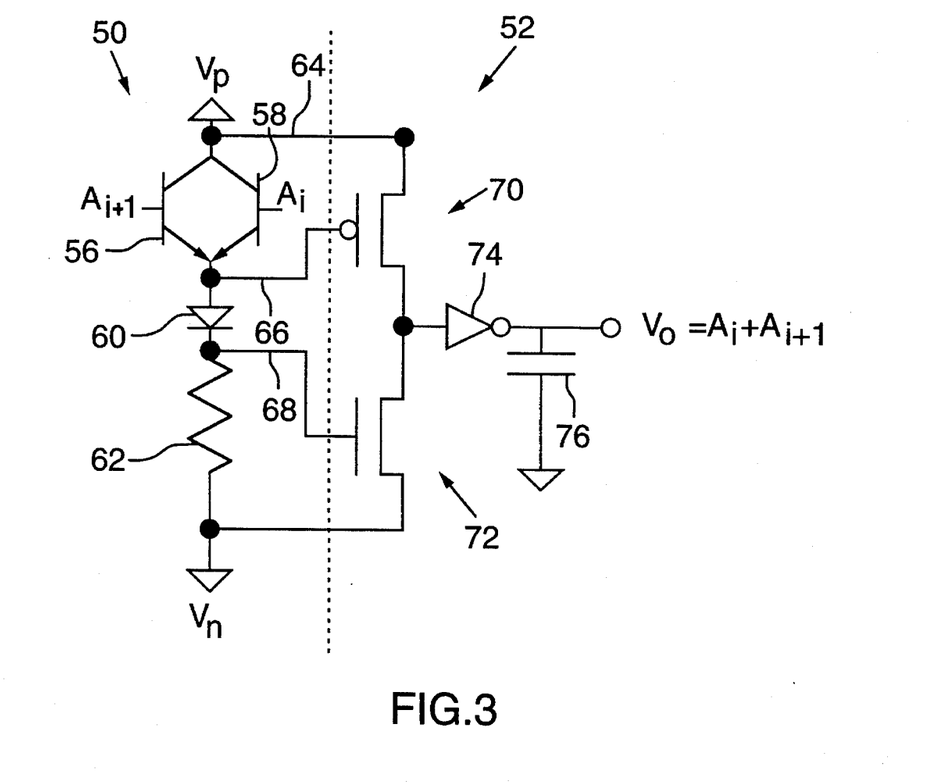
FIG. 3 is a circuit diagram of an embodiment of a W-OR predecoder and level translator forming part of the SRAM shown in FIG. 1.

Referring now to FIG. 3, an embodiment of a W-OR predecoder 50 and level translator 52 forming part of the arrays 40 and 42 respectively is shown. As can be seen, W-OR predecoder 50 includes a pair of transistors 56 and 58. The collectors of the transistors 56 and 58 are coupled and lead to a positive voltage source $V_p$. The base of transistor 58 is connected to the bit $A_i$ output of the ECL input buffer 16 and the base of transistor 56 is connected to the bit $A_{i+1}$ output of the ECL input buffer 16. The emitters of the transistors 56 and 58 are also coupled and lead to the anode of a diode 60. The cathode of the diode 60 is connected to ground $V_n$ through a resistor 62. The diode 60 and resistor 62 form the pull-down circuitry of the W-OR predecoder 50. The W-OR predecoder 50 also includes a logic output line 64 and two drive lines 66 and 68 respectively.

The level translator 52 is in the form of a single source follower and since it directly follows the W-OR predecoder 50, no problems arise as a result of using the two drive lines 64 and 66 respectively. Specifically, the level translator 52 includes a PMOS field effect transistor (FET) 70, an NMOS FET 72, an inverter 74 and a capacitor 76. FET 70 has its drain connected to output line 64 and its gate connected to the drive line 64. The source of FET 70 is connected to the inverter 74 as well as to the drain of FET 72. FET 72 has its gate connected to the drive line 68 and its source connected to ground $V$.. The capacitor 76 has one terminal connected between the inverter 74 and the output node $V_o$ of the level translator 52 and another terminal connected to ground $V_n$. The level translator 52 ensures that the output of the W-OR predecoder 50 is at CMOS levels. The inverter 74 ensures full-signal restoration and functions as a pre-driver for the following word-line decoder and driver circuit 44.

In operation, when the inputs $A_i$ and $A_{i+1}$ are both low, the two transistors 56 and 58 respectively are off and the potential on output line 64 is high and equal to the voltage source $V_p$. The potential on drive lines 66 and 68 is low turning FET 70 on and FET 72 off. Thus, the high potential on output line 64 is applied to inverter 74 through FET 70 resulting in a logic low output on output node $V_o$.

When either one or both inputs $A_i$ and $A_{i+1}$ is high, one or both of the transistors 56 and 58 is on. This results in the drive line 66 becoming coupled to the voltage source $V_p$ through one or both of the transistors placing a high potential on the drive line 66. This causes FET 70 to turn off. When one or both of the transistors 56 and 58 is on, drive line 68 also becomes coupled to the voltage source $V_p$ through one or both of the transistors as well as through diode 60. This causes FET 72 to turn on. Therefore, the inverter 74 becomes coupled to ground through FET 72 resulting in a logic high output on output node $V_o$.

The logic output on output node $V_o$ is supplied to either a block select line or word select line input of one of the WLDD circuits 44. Therefore, depending on the logic value inputs $A_x$ and $A_{x+1}$ to the various W-OR predecoders 50 in the array 40, different logic values are supplied to the various block select line and word select line inputs to the WLDD circuits 44. This allows selected blocks of the memory cell array 28 to be activated.

Figure 4:
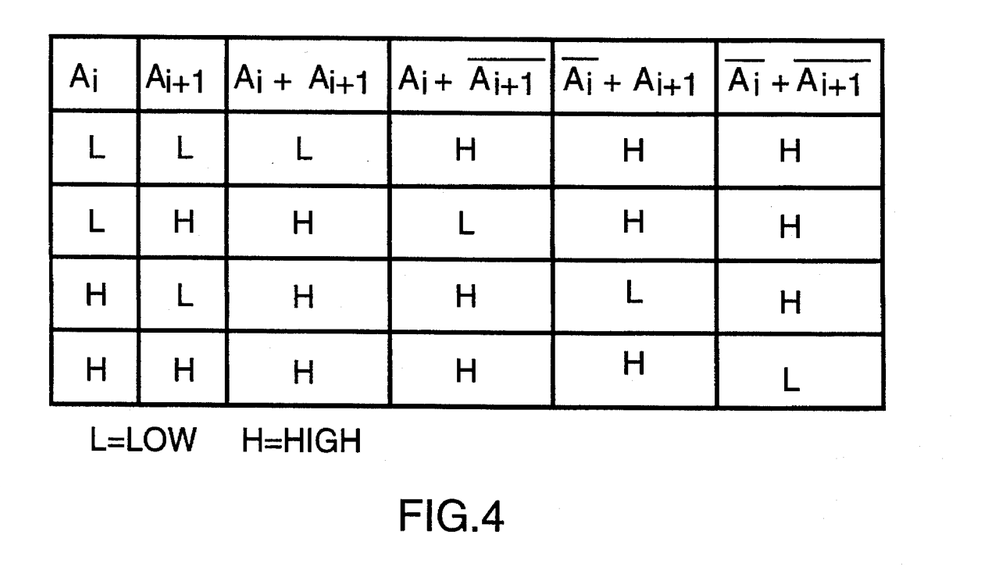
FIG. 4 is a logic table of the output of the W-OR predecoder and level translator shown in FIG. 3.

FIG. 4 shows the output of the W-OR predecoder 50 and level translator 52 under column $A_i+A_{i+1}$ for the various values of logic inputs $A_i$ and $A_{i+1}$. Since the ECL input buffer 16 generates two address outputs $A_x$ and $\overline{A}$ for each address input $A_x$, four W-OR predecoders 50 and level translators 52 of the type shown in FIG. 3 are necessary to generate the logic outputs under the four columns of the table illustrated in FIG. 4.

Figure 10:
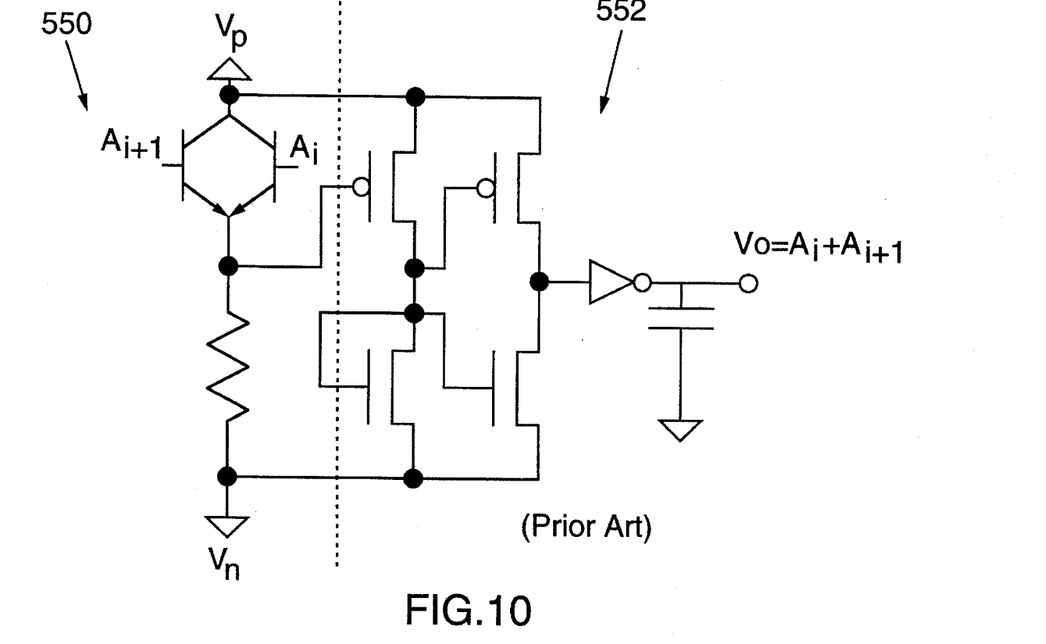
FIG. 10 is a circuit diagram of a prior art W-OR predecoder and level translator.

Because the diode 60 level shifts the input signal to the FET 72 when the FET is turned on and because the level translator 52 is in the form of a single source follower, the W-OR predecoder 50 and level translator 52 consume less power than conventional W-OR predecoders 550 and level translators 552 such as those shown in FIG. 10. As can be seen, the conventional W-OR predecoder 550 has a resistor pull-down circuit while the level translator 552 is in the form of a source follower having an NMOS current mirror load.

Figure 5:
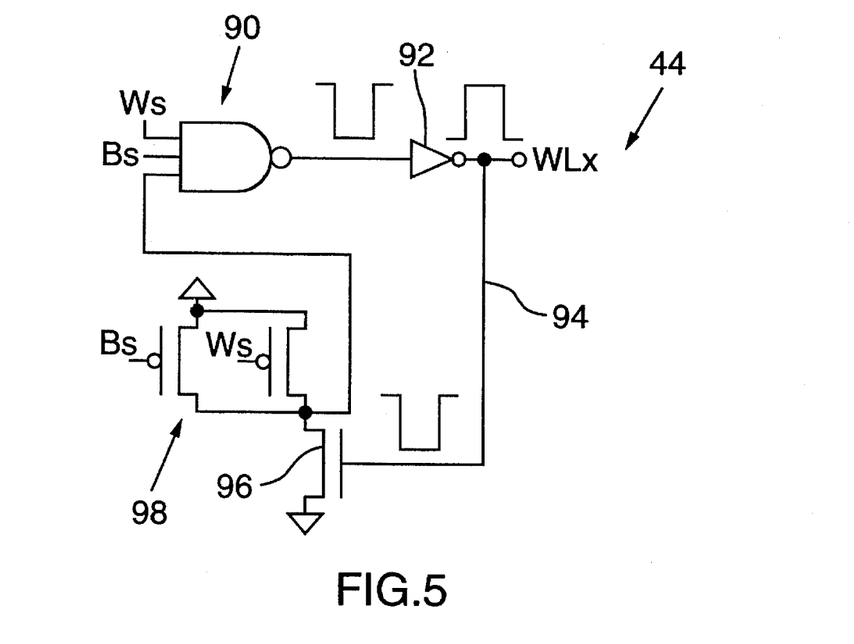
FIG. 5 is a schematic diagram of an embodiment of a word-line decoder and driver circuit forming part of the SRAM shown in FIG. 1.

Referring now to FIG. 5, one of the word-line decoder and driver (WLDD) circuits 44 forming part of the row decoder and driver 22 in accordance with the present invention is shown. The WLDD circuit 44 includes a NAND gate 90 having memory block select line $B_S$ and word select line $W_S$ inputs. The output of NAND gate 90 leads to an inverter 92 which provides the output of WLDD circuit 44. A feedback path 94 from the inverter output leads to an NMOS FET 96 forming part of a reset circuit which in turn is connected to a BiNMOS driver 98. The BiNMOS driver 98 also receives block select line $B_S$ and word select line $W_S$ inputs and supplies its output to NAND gate 90.

Figure 6:
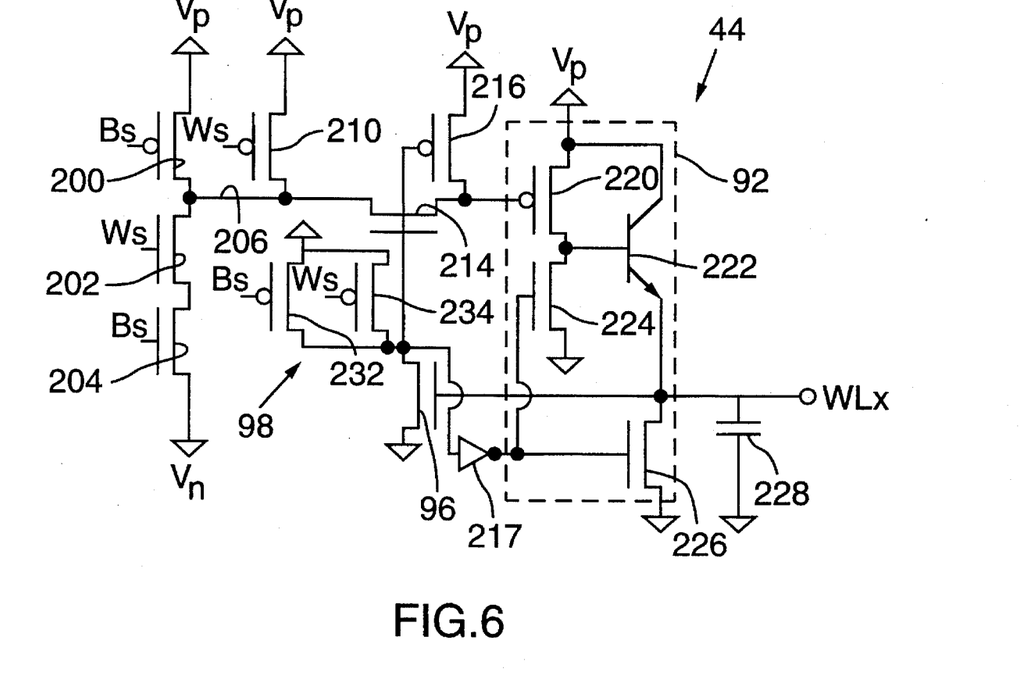
FIG. 6 is a circuit diagram of the word-line decoder and driver circuit shown in FIG. 5.

The equivalent circuit diagram of WLDD circuit 44 is shown in FIG. 6. As can be seen, NAND gate 90 includes PMOS FETs 200, 210 and 216, NMOS FETs 202, 204 and 214 as well as an inverter 217. Inverter 92 includes PMOS FET 220, NMOS FETs 224 and 226 as well as a transistor 222. The specific arrangement of the components forming the WLDD circuit will now be described. In particular, PMOS FET 200 has its drain leading to a positive voltage source $V_p$, its gate connected to a block select line $B_S$ and its source connected to the drain of NMOS FET 202. The base of FET 202 is connected to a word select line $W_S$ and the source of FET 202 is connected to the drain of NMOS FET 204. The base of FET 204 is connected to the block select line $B_S$ while the source of FET 204 is connected to ground $V_n$.

A line 206 is connected between the source of FET 200 and the drain of FET 202. Also connected to the line 206 is the source of PMOS FET 210. The base of FET 210 is connected to the word select line $W_S$ and the drain of FET 210 is connected to the voltage source $V_p$. The line 206 also leads to the drain of NMOS FET 214 which has its base connected to the BiNMOS driver 98 and to the base of PMOS FET 216. The source of FET 214 is connected to the source of FET 216. The drain of FET 216 is connected to the voltage source $V_p$.

PMOS FET 220 has its base connected to the source of FET 216. The drain of FET 220 is connected to the voltage source $V_p$ and to the collector of transistor 222. The source of FET 220 is connected to the base of transistor 220 and to the drain of NMOS FET 224. The source of FET 224 leads to ground while the gate of the FET 224 is connected to the output terminal of the inverter 217. The output terminal of the inverter 217 is also connected to the gate of NMOS FET 226. The source of FET 226 is connected to ground while the drain of FET 226 is connected to the emitter of transistor 222.

A capacitor 228 is coupled between the drain of FET 226 and ground. The gate of FET 96 is coupled between the drain of FET 226 and the emitter of transistor 222. The source of FET 96 leads to ground while its drain leads to the gates of FETs 214 and 216 and to the sources of PMOS FETs 232 and 234 respectively forming the BiNMOS driver 98. The drains of FETs 232 and 234 are coupled and lead to the voltage source $V_p$. The gate of FET 232 is connected to the block select line $B_S$ and the gate of FET 234 is connected to the word select line $W_S$.

FETs 200, 210, 232, 234 and 96 and the inverter 217 are designed to have close to minimum widths, since it has been found that they do not have to be large for proper operation of the WLDD circuit 44. Also, FET 220 and transistor 222 are merged to form a BiPMOS device. These devices have been found to achieve fast full swing operation when turned on and then off during output pull-up transition.

In operation, when one or both of the inputs to the block select and word select lines $B_S$ and $W_S$ respectively, are low FETs 200, 210, 232 and 234 are turned on and FETs 202 and 204 remain off. With FETs 232 and 234 turned on, a logic high input is supplied to the gate of FET 214 turning it on. A logic high input is in turn applied to the gate of FET 216 turning it off as well as to the input terminal of inverter 217. Inverter 217 in turn supplies a logic low output to the gates of FETs 224 and 226 keeping them off. With FET 214 on, the gate of FET 220 is coupled to the voltage source $V_p$ through one or both of FETs 200 and 210 turning it off. The voltage on the gate of FET 220 is greater than or equal to $V_p-V_{tp}$ where $V_{tp}$ is the threshold voltage of the FET. This maintains transistor 222 in an off-state resulting in a logic low appearing on the output node $WL_x$ as well as on the gate of FET 96 keeping it off.

When the inputs on both the block select and word select lines $B_S$ and $W_S$ become high as a result of output received from associated W-OR predecoders and level translators, the gate of FET 220 is discharged through the FETs 214, 202 and 204 and the FET 220 turns on. As a result, the base of transistor 222 begins charging until the transistor 222 turns on, thereby charging the output node $WL_x$ of the WLDD circuit 44.

When the output voltage on node $WL_x$ reaches a threshold value, the feedback FET 96 turns on and discharges the gates of FETs 214 and 216. This causes FET 214 to turn off and FET 216 to turn on. With FET 216 on, the gate of FET 220 becomes coupled to the voltage source $V_p$ through FET 216 causing FET 220 to turn off and inject half of its channel charge into the base of transistor 222. Transistor 222 in turn conducts further so that the output voltage on node $WL_x$ reaches its full swing. At this point, the input to inverter 217 goes low. Thus, inverter 217 supplies a logic high to FET 226 turning it on so that the voltage on output node $WL_x$ is discharged to ground bringing the output node low once again. Inverter 217 also supplies a logic high to the gate of FET 224 turning it on allowing the base of transistor 222 to discharge to ground and thereby turning transistor 222 off.

Figure 7A:
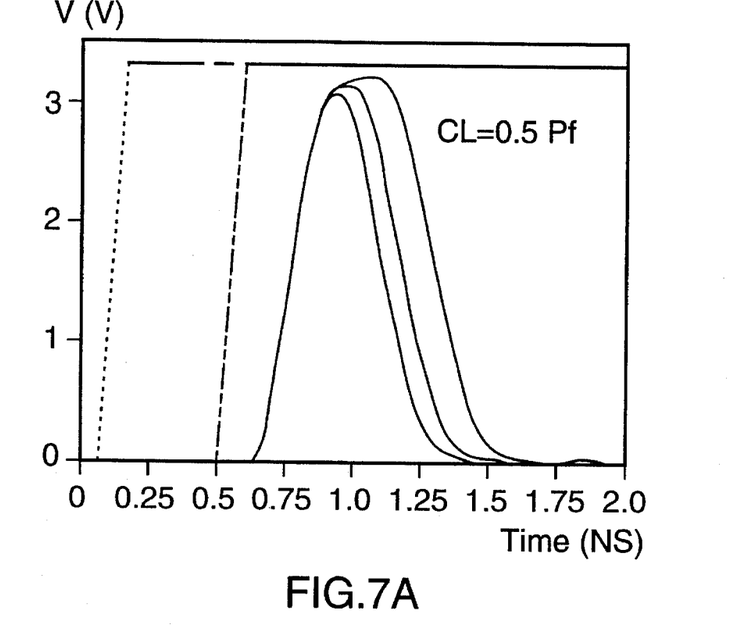
FIGS. 7a and 7b are graphs showing performance characteristics of the word-line decoder and driver circuit shown in FIGS. 5 and 6.

By controlling the sizes of the FET 96 and the inverter 217, the width of the output pulse appearing on output node $WL_x$ can be controlled. FIG. 7a shows the output of the WLDD circuit 44 in accordance with the present invention for a number of widths of FET 96 and inverter 217. As the Figure shows, when the inputs on the block select and word select lines $B_S$ and $W_S$ respectively are high, the WLDD circuit 44 produces a pulse with a finite width that is a function of the feedback speed. As the feedback speed increases, the pulse width becomes smaller. It can also be seen that there is a slight loss of output swing when the feedback speed is made very fast although this loss in swing is insignificant for a pulse width of 600 pS.

Figure 7B:
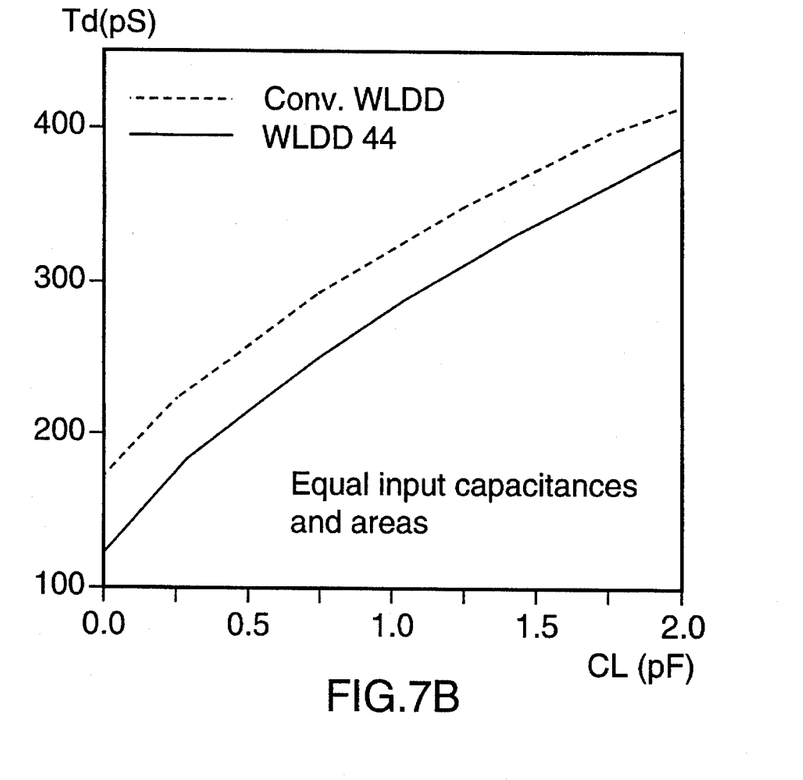

The WLDD circuit 44 was compared to a conventional BiNMOS WLDD circuit made up of a two-input CMOS NAND gate followed by a BiNMOS driver. Both circuits were designed to have equal input capacitances and areas. FIG. 7b shows the rise delays (from 50 percent of the input to 50 percent of the rising output) of both circuits. As can be seen, the delay of the WLDD circuit 44 is slightly less than that of the conventional circuit.

Although the speed improvement of the WLDD circuit is not large as compared with the conventional circuit, the WLDD circuit 44 significantly increases power savings due to the fact that it generates shorter duration output pulses as compared with conventional circuits. Since the WLDD circuit 44 can be configured to generate an output pulse having a pulse width of 0.6 nS, if a word line is activated by such a pulse (compared to a 5 nS pulse generated by a conventional WLDD circuit), the power consumed by the selected block of memory cells in memory cell array 28 is reduced by more than 8 times.

Figure 8:
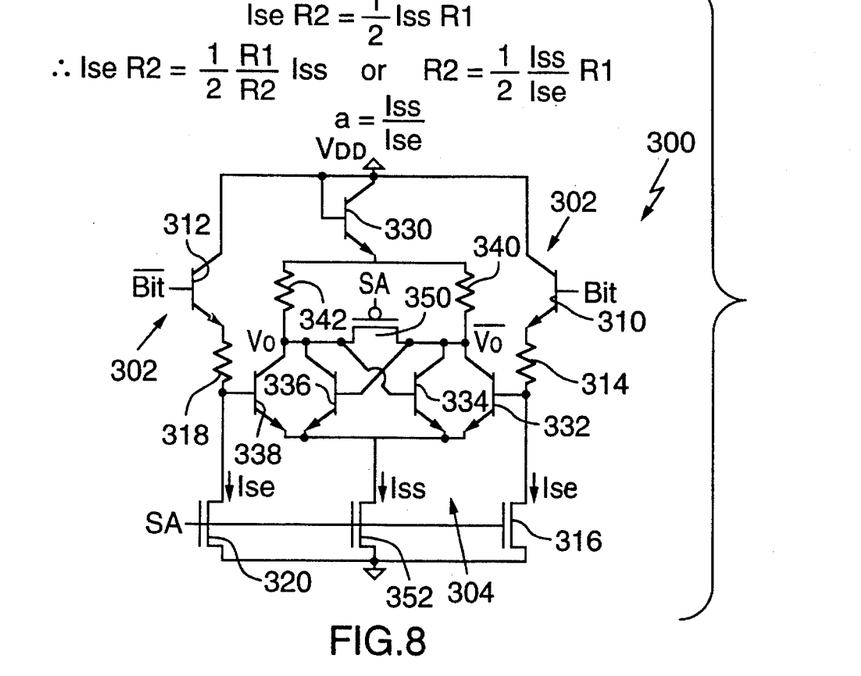
FIG. 8 is a circuit diagram of an ECL sense amplifier forming part of the SRAM shown in FIG. 1.

Referring now to FIG. 8, an unclocked latched-ECL sense amplifier forming part of sense amplifier array 30 is shown and is generally indicated by reference numeral 300. The amplifier 300 includes an emitter-follower input stage 302 followed by an ECL amplifier 304 with latched outputs.

The emitter-follower input stage includes a pair of transistors 310 and 312 having their collectors coupled to a positive voltage source $V_{DD}$. The base of transistor 310 receives input from a bit line Bit while the base of transistor 312 receives input from complement bit line $\overline{Bit}$. The bit lines Bit and $\overline{Bit}$ are pre-charged to voltage $V_{DD}$ by the bit line precharge circuit 28. The emitter of transistor 310 is connected to the ECL amplifier 304 via a resistor 314 as well as to the drain of an NMOS FET 316. The emitter of transistor 312 is also connected to the ECL amplifier 304 via a resistor 318 as well as to the drain of an NMOS FET 320.

The ECL amplifier 304 includes a transistor 330 having its collector and base coupled to voltage source $V_{DD}$. Because the base of transistor 330 is tied to its collector, transistor 330 acts as a diode. The emitter of transistor 330 leads to the collectors of transistors 332, 334, 336 and 338 by way of resistors 340 and 342 respectively. The collectors of transistors 332 and 334 are also connected to the drain of a PMOS FET 350, as well as to the base of transistor 336. The collectors of transistors 336 and 338 are also connected to the source of the FET 350, as well as to the base of the transistor 334. The gate of FET 350 leads to a signal line SA.

As can be seen, the design of the ECL amplifier 304 is electrically symmetrical. Emitter coupled transistors 332 and 334 and resistor 340 form one branch of the ECL amplifier while emitter coupled transistors 336 and 338 and resistor 342 form a second branch of the ECL amplifier 304.

The emitters of the four transistors 332 to 338 are coupled and lead to the drain of an NMOS FET 352. The sources of the FETs 316, 320 and 352 are coupled to ground. The gates of the FETs 316, 320 and 352 are also coupled and lead to signal line SA. The sense amplifier 300 provides two outputs $V_o$ and $\overline{V_o}$ representing the logic value of the sensed memory cell and its compliment.

When the sense-amplifier is activated by a logic high on signal line SA from the column decoder and driver, and with the bit lines Bit and $\overline{Bit}$ at their precharged state (i.e. @$V_{DD}$), the outputs of the sense-amplifier are discharged from their initial level ($\geq V_{DD}-V_{BE}$) to:

$$Vo(t=0^+) = \overline{Vo}(t=0^+) = VDD - V_{BE} - \frac{I_{ss}}{2} \cdot R1 \quad (1)$$

where:

$I_{SS}$ is the ECL amplifier tail current; and

R1 is the resistance of resistors 340 and 342.

In this state, the tail current $I_{SS}$ is equally divided between the two branches of the ECL amplifier 304. Also, the voltage outputs of the emitter-followers 302 applied to the bases of transistors 332 and 338 are:

$$V1=V2=VDD-V_{BE}-I_{SE}.R2 \quad (2)$$

where:

$I_{SE}$ is the tail current of the emitter-followers; and

R2 is the resistance of resistors 314 and 318.

During design, a condition is imposed on the sense-amplifier 300 as follows:

$$\frac{I_{ss}}{2} \cdot R1 = I_{se} \cdot R2 \quad (3)$$

which can be expressed as:

$$I_{se} = \frac{1}{2} I_{ss} \frac{R1}{R2} \quad (4)$$

or $$R2 = \frac{1}{2} R2 \frac{I_{ss}}{I_{se}} \quad (5)$$

Hence, the base-emitter voltages of transistors 332 and 338 are equal. The size of the diode-connected transistor 330 is proportional to the ratio between the two currents $I_{SS}$ and $I_{SE}$ to ensure the equality of the base voltages of transistors 332 and 338.

With the sense amplifier activated, when a memory cell 26a connected to the bit lines Bit and $\overline{Bit}$ extending to the sense-amplifier is selected, the memory cell pulls the voltage on one of the bit lines down depending on the logic value stored in the memory cell. If the memory cell contains a logic low, the voltage on bit line Bit is pulled down and the voltage on bit line $\overline{Bit}$ remains at $V_{DD}$. If the memory cell contains a logic high, the voltage on bit line $\overline{Bit}$ is pulled down and the voltage on bit line Bit remains at $V_{DD}$. In either case, the drop in the voltage on the bit line Bit or $\overline{Bit}$ is such so as not to compromise the content of the memory cell.

When the voltage on one of the bit lines drops, the current in the transistor connected to that bit line (and hence the current in that branch of the ECL amplifier) starts decreasing from its initial value of $\frac{1}{2}*I_{SS}$. Meanwhile, the current through the other branch starts increasing. This imbalance in the currents of the two branches is converted to a small differential voltage at the sense amplifier outputs $V_0$ and $\overline{V_0}$ respectively. Due to the back-to-back connections between the two outputs through transistors 334 and 336, a regenerative effect takes place which causes the total tail current to be quickly switched to the branch connected to the bit line with the higher voltage. At the end of this transition, the entire tail current $I_{SS}$ flows into one of the two transistors 334 or 336. The sensed output voltages $V_0$ and $\overline{V_0}$ remain constant even if the bit line voltages change (the latched-in state) until the sense amplifier 300 is reset as a result of the signal on signal line SA becoming low. The voltage difference between the two sensed outputs is:

$$\Delta Vo = I_{SS}.R1 \quad (6)$$

with the high output voltage being equal to $V_{DD}-V_{BE}$. At the end of the memory cell access, the memory cell recharges itself to its pre-sensed logic value.

Figure 9A:
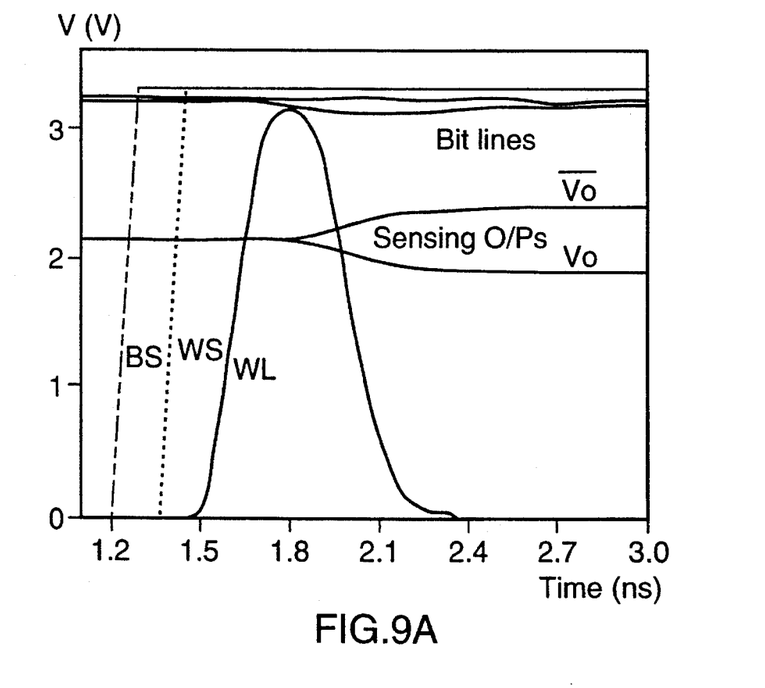
FIGS. 9a, 9b and 9c are graphs showing performance characteristics of the ECL sense amplifier shown in FIG. 8.

FIG. 9a shows a complete column-sensing operation performed by sense amplifier 300. This figure shows the block select line and word select line inputs $B_S$ and $W_S$ respectively to a WLDD circuit 44, the WL, output of the WLDD circuit, the bit line Bit input to the sense amplifier 300 as well as the sensed outputs $V_0$ and $\overline{V_0}$ of the sense amplifier. The latched sense amplifier 300 correctly read and latched-in the data on the bit lines which were activated for only 0.6 nS by the WLDD circuit 44. The sense amplifier 300 took less than 100 pS to latch-in the data on the bit lines. When operated at its maximum speed (optimum $I_{SS}$), the sense amplifier consumes approximately 11 mW of power. At this optimum speed, the total delay from the WL activation to the sensed outputs was less than 400 pS for a load of 3 fF at the sensed outputs. Another advantage of this sensing scheme is that the outputs are already level-shifted by the diode-connected transistor 330.

The design of the sense amplifier 300 makes it very resilient to process and supply variations. This is due to its symmetrical nature, the excellent matching of the bipolar devices, and the fact that resistors 314 and 318, and the three NMOS current sources (FETs 316, 320 and 352) are multiples of one another. Assuming that the resistors 314 and 318 are physically placed adjacent one another, any variation in the values of the resistors due to process variations will be consistent for both resistors. The same applies to the three NMOS FET current sources. Hence equations (1) through (6) will more or less always hold, and process supply variations will have a lesser effect on the correct operation of the sense amplifiers 300 in the array.

One concern with the sense amplifier 300 is the possibility of sensing, amplifying, and latching-in false bit line data (i.e. glitches). The regenerative nature of the sense amplifier 300 makes it prone to such erroneous behavior. To inhibit this from happening, the regenerative effect is slightly delayed, such that any bit line glitch that has a duration less than a certain value will not be latched-in. This is achieved by adjusting resistors 314 and 318, such that the initial value of the output voltage $V_0$ (given by equation (1) is slightly below the initial value of the voltages supplied to the bases of transistors 332 and 338 given by equation (2). This results in the following condition prevailing:

$$Vo(t=0^+)=\overline{Vo}(t=^+)=V1(t=0^+)-\Delta V_r=V2(t=0^+)-\Delta V_r \quad (7)$$

Hence the output regeneration will not start until one of the output voltages $V_0$ and $\overline{V_0}$ rises by at least $\Delta V_r$. The larger the voltage $\Delta V_r$, the more resistant the sense amplifier is to glitches. However, delaying the output regeneration reduces the speed of the sense amplifier 300 and hence, voltage $\Delta V_r$ should be kept to a minimum.

Figure 9B:
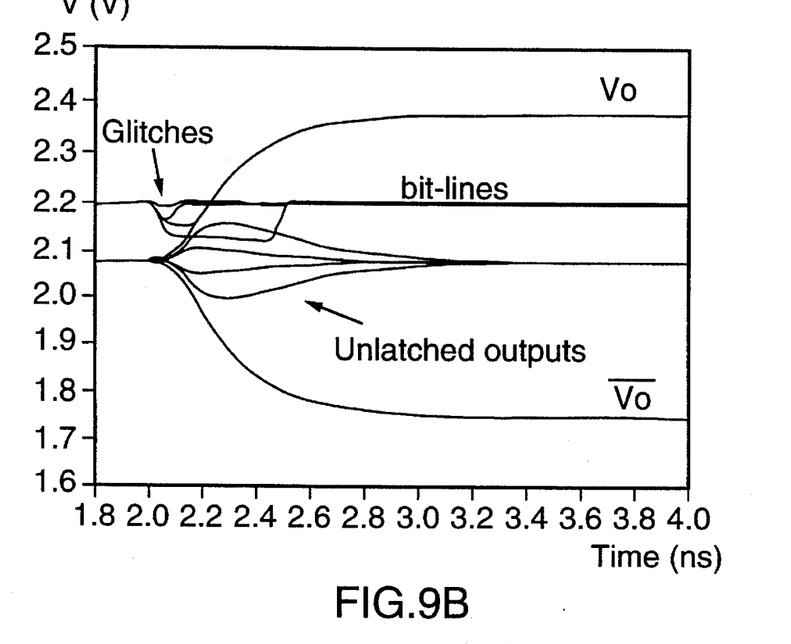

FIG. 9b shows the effect of bit line glitches on the sense amplifier outputs. Two bit line glitches having a 50 mV amplitude and 100 pS and 200 pS durations respectively, were applied to the sense amplifier 300 inputs. For these results, the sense amplifier 300 was designed such that $\Delta V_r$ was about 100 mV. As FIG. 9b shows, the temporary disturbance at the outputs were not latched-in. Although the gain of the amplifier was around 20, the output signals did not reach an amplitude of more than 80 mV before they quickly faded away. The response of the sense amplifier 300 to a correct bit line signal having a 75 mV amplitude and a duration of 500 pS is also shown in FIG. 9b. The sense amplifier correctly read the bit line signal and latched it in.

Figure 9C:
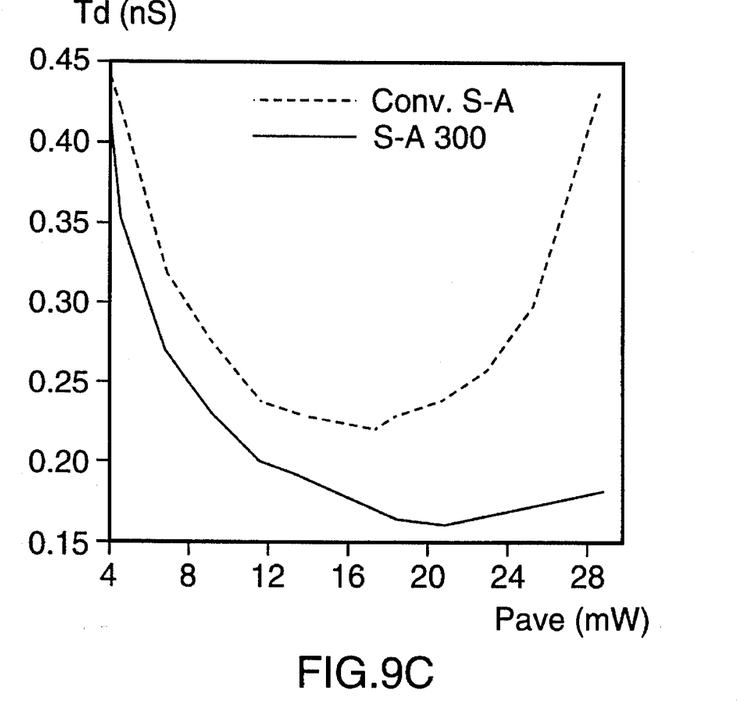

FIG. 9c shows the delay versus average power consumed for the sense amplifier 300 and for a conventional ECL sense amplifier having cross-coupled PMOS loads. The optimum delay of sense amplifier 300 was 160 pS, 25% faster than the conventional amplifier. At an average power of 8 mW, sense amplifier 300 had a delay of 250 pS, 20% lower than the conventional amplifier. Although the delay savings of the sense amplifier 300 do not seem significant as compared to the total access time of the SRAM 20, the power savings from the sensing technique are significant. The sense amplifier 300 also requires less area than the conventional sense amplifier.

Figure 11:
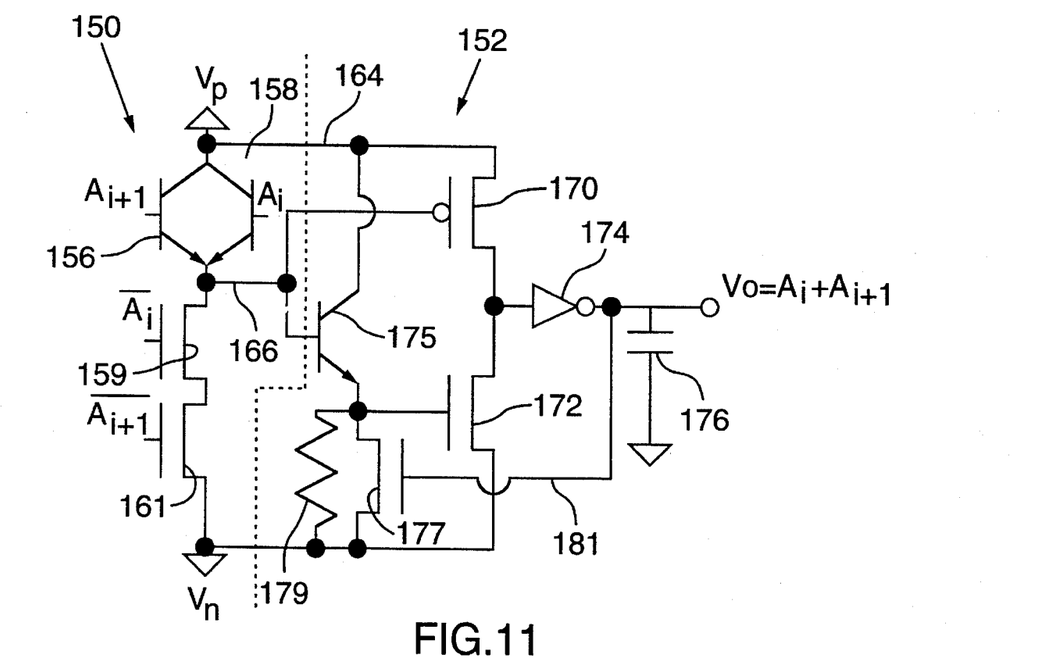
FIG. 11 is a circuit diagram of another embodiment of a W-OR predecoder and level translator.

Referring now to FIG. 11, an alternative embodiment of a W-OR predecoder 150 and level translator 152 is shown. In this embodiment like reference numerals of FIG. 3 will be used to indicate like components with a "100" added for clarity. The W-OR predecoder 150 includes a pair of transistors 156 and 158. The collectors of the transistors 156 and 158 are coupled and lead to a positive voltage source $V_p$. The base of transistor 158 is connected to the bit $\overline{A_i}$ output of the ECL input buffer 22 and the base of transistor 156 is connected to the bit $A_{i+1}$ output of the ECL input buffer 22. The emitters of the transistors 156 and 158 are also coupled and lead to the drain of an NMOS FET 159. The base of FET receives the bit $A_i$ output of the ECL input buffer 22. The source of FET 159 is connected to the drain of an NMOS FET 161. The base of FET 161 receives the bit $\overline{A_{i+1}}$ output of the ECL input buffer 22. The source of FET 161 is connected to ground $V_n$. The W-OR predecoder 150 also includes a logic output line 164 and a drive line 166 leading from the drain of FET 159.

The level translator 152 is also in the form of a single source follower. Specifically level translator includes a PMOS FET 170 having its drain connected to output line 164. The base of FET 170 is connected to the drive line 166. The source of FET 170 is connected to an inverter 174 as well as to the drain of an NMOS FET 172. FET 172 has its source connected to ground $V_n$ and its gate connected to the emitter of a transistor 175. The emitter of transistor 175 is also connected to the drain of an NMOS FET 177 and to one terminal of a large value resistor 179. The other terminal of the resistor 179 and the source of the FET 177 are connected to ground $V_n$. Transistor 175 has its collector connected to the output line 164 and its base connected to the drive line 166. A capacitor 176 has one terminal connected between the inverter 174 and the output node $V_o$ of the level translator 152 and another terminal connected to ground $V_n$. A feedback line 181 is connected between inverter 174 and capacitor 176 and leads to the gate of FET 177.

In operation, when the inputs $A_i$ and $A_{i+1}$ are both low, the two transistors 156 and 158 are off and the potential on output line 164 is high and equal to voltage source $V_p$. The inputs to the gates of FETs 159 and 161 are high thereby coupling drive line 166 to the ground resulting in a logic low being supplied to the gate of FET 170 and to the base of transistor 175. The logic low input to FET 170 turns it on allowing the high potential on output line 164 to be applied to the inverter 174 resulting in a logic low output at node $V_o$ and a logic low applied to FET 177 maintaining it in an off-state. Although a logic low is applied to the base of transistor 175, resistor 179 maintains the transistor slightly on to maintain the level shifting (i.e. the $V_{BE}$ drop) of the input to FET 172 keeping the power consumption of the level translator low. In this case, the input to FET 172 is still insufficient to turn it on. Since resistor 179 is large, when FET 177 is off very little current is drawn by the resistor.

When either one or both inputs $A_i$ and $A_{i+1}$ are high, either or both of the transistors 156 and 158 are on and one or both of FETs 159 and 161 are off. This results in the drive line 166 being connected to the voltage source $V_p$ through one or both the transistors 156 and 158 causing transistor 175 to turn on and FET 170 to turn off. With transistor 175 turned on, FET 172 is turned on as a result of the potential on output line 164. With FET 172 on, inverter 174 is coupled to ground through FET 172 resulting in a logic high output at output node $V_0$. The logic high output is fed back to FET 177 turning it on.

The pull-down circuitry of the W-OR predecoder 150 in this embodiment is implemented using the FETs 159 and 161 which are controlled by outputs $\overline{A_i}$ and $A_{i+1}$ of the ECL input buffer 22 instead of resistors. This pull-down circuit design consumes the least amount of power when the output is high (i.e. when $A_i$ and $A_{i+1}$ are high) since no current flows through the FETs 159 and 161. The level-shifting of the level translator 152 is achieved by the transistor 175 and the feedback controlled FET 177. The resistor 179 ensures that the input to the FET 172 is level shifted even when FET 177 is off for a long time. Although the design of this level translator 152 consumes more power than that of the embodiment shown in FIG. 3, the W-OR predecoder 150 consumes significantly less power than that consumed by W-OR predecoder 50.

Figure 12:
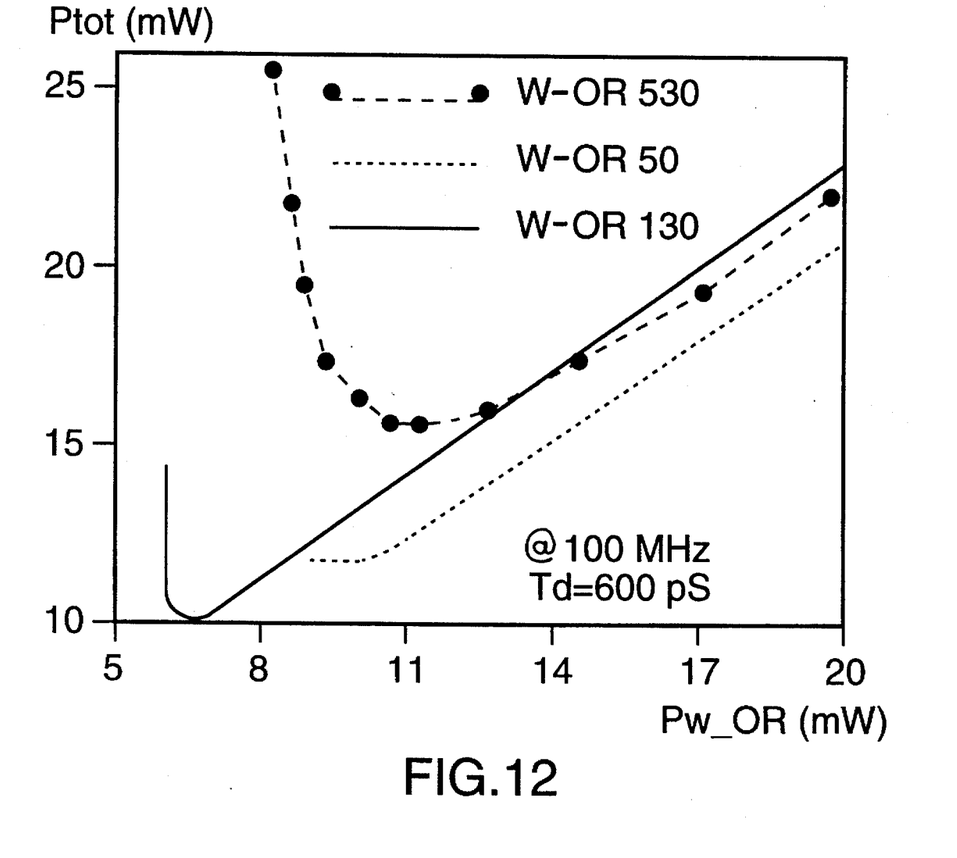
FIG. 12 is a graph showing performance characteristics of the W-OR predecoder and level translators shown in FIGS. 3, 10 and 11.

FIG. 12 shows a plot of the power consumption of the W-OR predecoders and level translators shown in FIGS. 3, 10 and 11. In each case, the average power of the W-OR predecoder including the ECL input buffer was varied and the level translator was sized to obtain a delay of 600 pS. As can be seen, in the W-OR predecoders and level translators shown in FIGS. 3 and 11, the power consumption of the W-OR predecoders could not be reduced below 9 mW. The conventional W-OR predecoder and level translator had an optimum power of 15.6 mW. The W-OR predecoder and level translators of FIGS. 3 and 11 however, had optimum powers of 11.7 mW and 10.1 mW respectively.

Although W-OR predecoder 150 and level translator 152 consume less power than those of the embodiment illustrated in FIG. 3, they also require more area. Therefore, if area constants are critical, W-OR predecoder 50 and level translator 52 are better suited although they consume more power.

By comparing alternative configurations of front-ends for the SRAM 20, it has been found that an optimum front-end combination for a 16 $Mb^+$ SRAM access path includes an ECL input buffer, followed by a W-OR predecoder array, immediately followed by a level-translator array and, then followed by BiNMOS word line decoders and drivers. The present SRAM includes such an optimum front-end. The design of the circuits forming the front-end have also been selected to reduce power consumption allowing a SRAM to be developed which significantly reduces overall power consumption as compared to prior art designs. Moreover, the SRAM includes a novel sense amplifier design to reduce further power consumption.

Although specific embodiments of circuit designs for use in a SRAM have been described, those of skill in the art will appreciate that modifications and/or variations may be made to the present invention without departing from the scope thereof as defined by the appended claims.

We claim:

1. A front-end for a static random access memory having a memory cell array for storing data comprising:

an ECL input buffer receiving address values from an address bus representing memory cell locations in said memory cell array and outputting said address values and complements thereof;

a W-OR predecoder and level translator array connected to said ECL input buffer and receiving said address values and address value complements, said W-OR predecoder and level translator array generating logic OR output values in response to input from said ECL input buffer at MOS signal levels, the level translators in said array being in the form of single source followers connected directly to W-OR predecoders; and self-resetting row decoder and driver circuits responsive to said logic OR output values for generating logic word line output pulses to said memory cell array to activate selected memory cells of said memory cell array corresponding to said address values.

2. A front-end for a static random access memory as defined in claim 1 wherein said row decoder and driver circuits are configured to generate word line output pulses having pulse widths of a desired duration.

3. A front-end for a static random access memory as defined in claim 2 wherein said word line output pulses have pulse widths approximately equal to 0.6 nS.

4. A front-end for a static random access memory as defined in claim 2 wherein said row decoder and driver circuits each include a logic gate responsive to memory block select and word select inputs from said W-OR predecoder and level translator array and generating said word line output pulses in response thereto; a driver responsive to said memory block select and word select inputs and supplying input to said logic gate; and reset means responsive to a logic high word line output pulse and returning the output of said row decoder and driver circuit to a logic low condition after said desired duration.

5. A W-OR predecoder and level translation circuit for the front-end of a static random access memory comprising:

a W-OR predecoder receiving address inputs from an ECL input buffer and generating logic output in response thereto; and a level translator in the form of a single source follower responsive to said W-OR predecoder for level shifting the logic output of said W-OR predecoder.

6. A W-OR predecoder and level translation circuit as defined in claim 5 wherein said W-OR predecoder includes a pair of transistors having coupled collectors and emitters, each transistor receiving an address input on the base thereof, said collectors being coupled to a high potential node; and a pull-down circuit coupled between said emitters and a low potential node, said W-OR predecoder providing said logic output on an output line coupled to said high potential node and providing drive input to said level translator via at least one drive line coupled to said emitters.

7. A W-OR predecoder and level translation circuit as defined in claim 6 wherein said pull-down circuit includes a diode having one terminal thereof connected to said emitters and a resistor connected between the other terminal of said diode and said low potential node, said W-OR predecoder supplying drive input to said level translator via a pair of drive lines, one of said drive lines being connected to said emitters and the other of said drive lines being connected to the other terminal of said diode.

8. A W-OR predecoder and level translation circuit as defined in claim 7 wherein said level translator includes a pair of FETs, one of said FETs having a drain terminal connected to said output line, a gate terminal connected to said one drive line and a source terminal connected to an output node, the other of said FETs having a drain terminal connected to said output node, a gate terminal connected to said other drive line and a source terminal connected to said low potential node, said FETs being configured so that only one of said FETs is in an on-state at a time.

9. A W-OR predecoder and level translation circuit as defined in claim 8 wherein said one FET is in said on-state when said address inputs to said W-OR predecoder are low to couple said output node to said output line, said level translator further including an inverter having an input terminal connected to the source terminal of said one FET and to the drain terminal of said other FET and having an output terminal leading to said output node.

10. A W-OR predecoder and level translation circuit as defined in claim 6 wherein said pull-down circuit includes a first pair of FETs coupled between said emitters and said low potential node, one of said FETs having a drain terminal connected to said emitters and a source terminal connected to a drain terminal of the other FET, said other FET having a source terminal connected to said low potential node, the gate terminals of each FET receiving a complement of one of the address inputs supplied to said transistors.

11. A W-OR predecoder and level translation circuit as defined in claim 10 wherein said level translator includes a second pair of FETs, one of said FETs having a drain terminal connected to said output line, a gate terminal connected to a drive line and a source terminal connected to an output node, the other of said FETs having a drain terminal connected to said output node, a gate terminal connected to a drive circuit receiving input from said drive line and a source terminal connected to said low potential node, said FETs being configured so that only one of said FETs is in an on-state at a time.

12. A W-OR predecoder and level translation circuit as defined in claim 11 wherein said one FET is in said on-state when said address inputs to said W-OR predecoder are low to couple said output node to said output line, said level translator further including an inverter having an input terminal connected to the source terminal of said one FET and to the drain terminal of said other FET and having an output terminal leading to said output node.

13. A W-OR predecoder and level translation circuit as defined in claim 12 wherein said drive circuit includes a transistor having a base connected to said drive line, a collector connected to said output line and an emitter connected to the gate of said other FET, said drive circuit further including a third FET and a resistor arranged in parallel between the emitter of said transistor and said low potential node, said third FET having its drain terminal connected to said emitter, its source terminal connected to said low potential node and its gate terminal connected to a feedback path extending from said output node.

14. A row decoder and driver circuit for a static random access memory comprising:

a logic gate responsive to memory block select and word select inputs and generating logic output on an output node in accordance with inputs thereto;

a driver responsive to said memory block select and word select inputs and supplying input to said logic gate; and reset means responsive to a logic high condition on said output node for returning said output node to a logic low condition after a predetermined duration.

15. A row decoder and driver circuit as defined in claim 14 wherein said reset means includes a semiconductor switch to couple the output node to a low potential terminal to allow said output node to discharge and thereby return said output node to said logic low condition.

16. A row decoder and driver circuit as defined in claim 15 wherein said reset means further includes an inverter responsive to input from said driver, said semiconductor switch being responsive to logic high input from said inverter to couple said output node to said low potential terminal.

17. A row decoder and driver circuit as defined in claim 16 wherein said reset means further includes a second semiconductor switch coupled to said output node via a feedback path, said second semiconductor switch being responsive to said logic high condition on said output node to couple the input terminal of said inverter to said low potential terminal.

18. A row decoder and driver circuit as defined in claim 17 wherein said logic gate is a NAND gate and wherein said driver is a BiCMOS driver.

19. A row decoder and driver circuit as defined in claim 17 wherein the widths of said inverter and said second semiconductor switch are selected to establish said predetermined duration.

20. A row decoder and driver circuit as defined in claim 19 wherein said widths are selected so that said logic high condition has a pre-determined duration equal to approximately 0.6 nS.

21. A sense amplifier to sense the state of a memory cell in a memory cell array forming a part of a static random access memory comprising:

an emitter-follower input stage receiving input from complementary bit lines connected to an activated memory cell to be sensed; and an ECL amplifier responsive to said emitter-follower input stage and to memory cell activation signals, said ECL amplifier having latched outputs and generating output signals $V_0$ and $\overline{V_0}$ thereon representing the sensed state of said memory cell and the complement thereof.

22. A sense amplifier as defined in claim 21 wherein said ECL amplifier maintains said output signals $V_0$ and $\overline{V_0}$ until said activation signal changes from a logic high state to a logic low state.

23. A sense amplifier as defined in claim 22 wherein said sense amplifier is electrically symmetrical.

24. A sense amplifier as defined in claim 23 wherein said ECL amplifier includes a pair of electrically parallel branches, each branch including a pair of transistors having coupled collectors and emitters, the coupled collectors of said pairs of transistors constituting complementary output nodes on which said output signals $V_0$ and $\overline{V_0}$ are applied, the base of one transistor of each pair being biased by an emitter follower of said emitter follower input stage, the base of the other transistor of each pair being coupled to the collectors of the other pair of transistors.

25. A sense amplifier as defined in claim 24 wherein said branches are coupled to a high potential node through a diode and are coupled to a low potential node through a first current source responsive to said activation signal.

26. A sense amplifier as defined in claim 25 further including a semiconductor switch interconnecting the collectors of each pair of transistors, said semiconductor switch being responsive to the absence of said activation signal to couple electrically the collectors of each pair of transistors to reset the output on said complementary output nodes.

27. A sense amplifier as defined in claim 26 wherein each of said emitter followers includes a transistor having a collector coupled to said high potential node, a base coupled to one of said complimentary bit lines, and an emitter coupled to the base of a transistor in said ECL amplifier by way of a resistor and coupled to the low potential node by way of said resistor and a second current source, said second current source being responsive to said activation signal.

28. A sense amplifier as defined in claim 27 wherein the resistors in said emitter followers are selected so that the voltage supplied to the base of the transistor in said ECL amplifier is slightly below the voltage at said complimentary output nodes prior to sensing of said memory cell.

29. A static random access memory comprising:

a memory cell array for storing data;

an ECL input buffer receiving address values from an address bus representing memory cell locations in said memory cell array and outputting said address values and complements thereof;

a W-OR predecoder and level translator array connected to said ECL input buffer and receiving said address values and address value complements, said W-OR predecoder and level translator array generating logic OR output values in response to input from said ECL input buffer at MOS signal levels, each W-OR predecoder and level translator in said array including a W-OR predecoder receiving address inputs from said ECL input buffer and generating logic output in response thereto; and a level translator in the form of a single source follower responsive to said W-OR predecoder for level shifting the logic output of said W-OR predecoder;

self-resetting row decoder and driver circuits responsive to said logic OR output values for generating logic word line output pulses to said memory cell array to activate selected cells of said memory cell array corresponding to said address values received by said ECL input buffer;

an unclocked latched ECL sense amplifier array connected to bit lines extending to said memory cell array for sensing the data value of memory cells of said memory cell array activated by said word line output pulses;

column decoder and driver circuits responsive to said logic OR output values to activate the sense amplifiers connected to the selected memory cells; and an output buffer, coupled to said ECL sense amplifier array, for storing the sensed data values of said selected memory cells.

30. A static random access memory as defined in claim 29 wherein each row decoder and driver circuit includes a logic gate responsive to memory block select and word select inputs from said W-OR predecoder and level translator array and generating said logic word line output pulses in response thereto; a driver responsive to said memory block select and word select inputs and supplying input to said logic gate; and reset means responsive to a logic high word line output pulse and returning the output of said row decoder and driver circuit to a logic low condition after a pre-determined desired duration.

31. A static random access memory as defined in claim 30 wherein said logic high word line output pulses have a pre-determined duration equal to approximately 0.6 nS.

32. A static random access memory as defined in claim 29 wherein each sense amplifier includes an emitter-follower input stage receiving input from complementary bit lines connected to an activated memory cell to be sensed; and an ECL amplifier responsive to said emitter-follower input stage and to memory cell activation signals, said ECL amplifier having latched outputs and generating output signals $V_0$ and $\overline{V_0}$ thereon representing the sensed state of said memory cell and the complement thereof.

33. A static random access memory as defined in claim 32 wherein each of said sense amplifiers is electrically symmetrical.

34. A static random access memory comprising:

a memory cell array for storing data;

an ECL input buffer receiving address values from an address bus representing memory cell locations in said memory cell array and outputting said address values and complements thereof;

a W-OR predecoder and level translator array connected to said ECL input buffer and receiving said address values and address value complements, said W-OR predecoder and level translator array generating logic OR output values in response to input from said ECL input buffer at MOS signal levels;

self-resetting row decoder and driver circuits responsive to said logic OR output values for generating logic word line output pulses to said memory cell array to activate selected cells of said memory cell array corresponding to said address values received by said ECL input buffer, each row decoder and driver circuit including a logic gate responsive to memory block select and word select inputs from said W-OR predecoder and level translator array and generating said logic word line output pulses in response thereto; a driver responsive to said memory block select and word select inputs and supplying input to said logic gate; and reset means responsive to a logic high word line output pulse and returning the output of said row decoder and driver circuit to a logic low condition after a predetermined duration;

a sense amplifier array connected to bit lines extending to said memory cell array for sensing the data value of memory cells of said memory cell array activated by said word line output pulses, each sense amplifier including an emitter-follower input stage receiving input from complementary bit lines connected to an activated memory cell to be sensed; and an ECL amplifier responsive to said emitter-follower input stage and to memory cell activation signals, said sense amplifier having latched outputs and generating output signals $V_0$ and $\overline{V_0}$ thereon representing the sensed state of said memory cell and the complement thereof;

column decoder and driver circuits responsive to said logic OR output values and generating said activation signals to activate the sense amplifiers connected to the selected memory cells; and an output buffer, coupled to said sense amplifier array, for storing the sensed data values of said selected memory cells.

35. A static random access memory as defined in claim 34 wherein said word line output pulses have a predetermined duration equal to approximately 0.6 nS.

36. A static random access memory as defined in claim 35 wherein each of said sense amplifiers is electrically symmetrical.

* * * * *